(12) United States Patent
Kurby

(10) Patent No.: US 9,571,262 B2
(45) Date of Patent: Feb. 14, 2017

(54) HYBRID TIMING FOR A GNSS RECEIVER

(71) Applicant: iPosi, Inc., Denver, CO (US)

(72) Inventor: Christopher Neil Kurby, Streamwood, IL (US)

(73) Assignee: iPosi, Inc., Denver, CO (US)

( * ) Notice: Subject to any disclaimer, the term of this patent is extended or adjusted under 35 U.S.C. 154(b) by 0 days.

(21) Appl. No.: 14/985,744

(22) Filed: Dec. 31, 2015

(65) Prior Publication Data

US 2016/0269170 A1  Sep. 15, 2016

Related U.S. Application Data

(60) Provisional application No. 62/098,738, filed on Dec. 31, 2014.

(51) Int. Cl.
*H04L 7/00* (2006.01)
*H04L 12/26* (2006.01)

(52) U.S. Cl.
CPC .......... *H04L 7/0025* (2013.01); *H04L 7/0012* (2013.01); *H04L 43/16* (2013.01)

(58) Field of Classification Search
CPC ... H04J 3/0641; H04J 3/0658; H04L 27/0014; H04L 29/06; H04W 56/0015; H04W 84/045
USPC ........................................ 375/355, 356, 362
See application file for complete search history.

(56) References Cited

U.S. PATENT DOCUMENTS

| | | |
|---|---|---|
| 5,422,813 A | 6/1995 | Schuchman et al. |
| 7,606,541 B1 | 10/2009 | Nicholls et al. |
| 2003/0048758 A1* | 3/2003 | Jones .................... H03L 7/0993 370/280 |
| 2009/0225743 A1 | 9/2009 | Nicholls et al. |
| 2012/0195253 A1 | 8/2012 | Irvine |
| 2013/0227172 A1* | 8/2013 | Zheng .................. H04J 3/0641 709/248 |
| 2013/0281080 A1* | 10/2013 | Carmon .............. H04L 27/0014 455/422.1 |

(Continued)

*Primary Examiner* — David S Huang
(74) *Attorney, Agent, or Firm* — Marsh Fischmann & Breyfogle LLP

(57) ABSTRACT

Synchronization of a time base at a local clock to a reference time. Initially, correction data (e.g., synchronization data) may be derived from packet data received over an asynchronous packet-switched network (e.g., the internet). Correction data derived from the packet data may be used to correct at least a portion of the time base (e.g., a frequency component). In turn, once the time base is corrected (e.g., to better than a predetermined quality threshold), the source of synchronization data may change to an alternate (e.g., more accurate source) such as positioning signals from a positioning system. In this regard, the corrected time base may be used to assist in acquiring such positioning signals to allow for higher accuracy correction. Furthermore, use of the positioning system may allow for correction of a phase of the time base (e.g., to align the phase to the positioning system. In turn, an accurate time base may be utilized (e.g., for location determination using the positioning system) and/or other contexts such as a downstream communication operation. For instance, a device employing the synchronization techniques described herein may be an LTE base station used to facilitate downstream communication with another device by use of the synchronized time base.

18 Claims, 7 Drawing Sheets

(56) References Cited

U.S. PATENT DOCUMENTS

2014/0370912 A1 12/2014 Kurby

* cited by examiner

HYBRID TIMING FOR A GNSS RECEIVER

RELATED APPLICATIONS

This application claims benefit of priority to U.S. Provisional Application No. 62/098,738 filed on Dec. 31, 2014 entitled "HYBRID TIMING FOR A GNSS RECEIVER," which is incorporated by reference.

BACKGROUND

In-building devices like LTE base stations, positioning system receivers, VoIP phones, or the like, may need to be time synchronized for optimum performance and capacity. As such, variations in the frequency and/or phase in the time base for such devices may lead to performance degradation or malfunctions. Additionally, the positions of such devices may need to be located without the aid of a human to allow for error-free and autonomous location.

Prior approaches to synchronization of the time of a device such as an LTE base station may include use of network synchronization techniques that rely on communication over a network to which the device is connected. For instance, the precision time protocol (PTP or IEEE 1588) includes a packet system, which provides for time and frequency information derived from an Internet connection. However, PTP does not facilitate location determination. Also, this approach is susceptible to error in output time and frequency in instances of complex network topology (e.g., where there are a lot of Internet switches and routers between the time source and the end device).

In other approaches, use of GNSS signals (e.g., GPS or the like) may be utilized to provide synchronization and/or location determination. However, GNSS signals may be highly attenuated and/or prone to error when the receiver is located within a structure or the like. In turn, such GNSS approaches may be impractical when utilized for receivers located in buildings, especially those devices located deep within a structure. Accordingly, the need persists for approaches to provide highly accurate and precise time base synchronization.

SUMMARY

The present disclosure generally relates to synchronization of a time base of a device (i.e., including the phase or time and frequency of the device). In particular, the present disclosure relates to coordinated or coupled utilization of different sources of synchronization data. In this regard, a first source of synchronization data may be utilized in a first period to correct at least a portion (e.g., a frequency portion) of the time base of the device. In a second time period, a second source may be utilized to correct or synchronize a time base of a device.

Accordingly, the first source of synchronization data may be a synchronization communication received at the device from an asynchronous packet-switched communication network (e.g., the internet). In this regard, the asynchronous packet-switched communication network may be relatively reliably provided to the device. That is, the connection to the asynchronous packet-switched communication network may be readily provided to the device (e.g., by way of an Internet connection). However, the first synchronization data received over the asynchronous packet switched communication network may be somewhat limited in the correction that may be provided utilizing the synchronization data. For instance, while the first synchronization data provided over the asynchronous communication network may be capable of being utilized to correct a frequency portion of the time base of the device, the first synchronization data may not provide any information regarding phase of the time base (e.g., relative to a time maintained at a positioning system). Furthermore, while the frequency derived from the asynchronous communication network may provide sufficient accuracy to assist in acquiring positioning system signals, it may be insufficient to sufficiently synchronize a device for use (e.g., as a LTE base station, VoIP phone, or other communication device).

In turn, second synchronization data may be provided that is capable of synchronizing both frequency and phase portions of the time base of the device. For example, the second synchronization data may include data derived from signals received from a positioning system (e.g., a GNSS system such as GPS or the like). However, acquisition of GNSS signals may be difficult to acquire in the absence some priming or initial correction of the time base. In this regard, the acquisition process utilized to acquire the GNSS signals may be based on a corrected time base that includes an at least partially corrected time base (e.g., a time base with a corrected frequency portion) derived from corrections based on the first synchronization data. That is, the first synchronization data received by the asynchronous packet-switched communication network may be utilized to prime a GNSS receiver (e.g., a highly sensitive receiver capable of acquiring signals in a highly attenuated environment) so as to assist or improve an acquisition of GNSS signals that may in turn be utilized to further correct the time base. For example, upon acquisition of the GNSS signals, both the frequency portion and a phase portion of the time base may be synchronized to the positioning system. In turn, in-phase timing with correct frequency may be provided. As may be appreciated, this may be useful in determining the position of device utilizing the positioning system signals received and/or may also be utilized for further downstream communication such as, for example, use as a time base for a LTE base station or other communication modality.

The utilization of the second synchronization data to provide phase correction may be important in the context of the GNSS system. For example, often times a GNSS receiver utilizes coherent integration of received positioning system signals to assist in signal processing for initial acquisition or signal identification. Furthermore, non-coherent integration may also be used. The period for such coherent and/or non-coherent integration may cover a relatively long duration (e.g., greater than 10 seconds, greater than 100 seconds, or even greater than 300 seconds). Such techniques for coherent and/or non-coherent integration are common in the art, but all rely on accurate time bases that are both synchronized in relation to frequency and phase. For example, a positioning system code may be utilized in connection with the positioning system signal. The ability to discern this code may be important for initial acquisition of the signal (i.e., that is recognition of the signal from other noise present). However, identification of such a code may require determining a phase of the code, which requires accurate phase alignment of the receiver's time base in relation to the code phase.

In turn, while coherent and/or non-coherent integration may be utilized as is common in the art, the use of a time base that is out of phase from the positioning system signal may result in errors associated with the integration. That is, utilization of a time base at a device that is out of phase with respect to the phase of the positioning system may result in correlation results over the coherent and/or non-coherent integration period that may not sum coincidentally. In this regard, the result of the integration may be a non-ideal sum that would actually detract from the sensitivity of the receiver. In turn, utilization of the coupled synchronization techniques utilizing both first synchronization data from the first source and second synchronization data from the second source may allow for phase correction as well as frequency correction of the time base the device to allow for, for example, improved coherent and/or non-coherent integration of a positioning signal during positioning signal acquisition.

In any regard, the correction of the time base may be accomplished by a synchronization module. In this regard, the synchronization module may include the ability for fine adjustment and course adjustment of the time base frequency. For example, the time base may be at least partially based on a reference oscillator local to the system. The reference oscillator may be a voltage control oscillator that may be controlled by way of varying a voltage applied to the oscillator. However, use of a change in voltage applied to the oscillator may result in relatively course adjustments to the frequency of the oscillator. Furthermore, voltage correction of the oscillator may have non-linearity in the voltage control system that results in errors. Synchronization of the frequency portion of the time base may require finer control of the corrections to the frequency portion of time base. In turn, a fine adjustment module may be provided that allows for fine control of the frequency of the reference oscillator provide highly precise synchronization relative to the synchronization data provided. For example, a divider module may be for provided that allows for fine control of the device.

In any regard, the synchronization module may be responsive to any of a plurality of sources of synchronization data to connect or synchronize a given local oscillator based on any of the sources of synchronization data. In this regard, a switch may be provided that allows for selective input of either first synchronization data from the first source or second synchronization data from the second source to be provided for utilization in synchronization or correction of the time base of the device. In this regard, the time synchronization sources may be coupled such that the device may be operative to selectively change between sources for synchronization information (e.g., based on comparison of the time base and/or synchronization data to threshold data).

This may be particularly useful in the case of in-building receivers that, for example, may have limited access to positioning system signals. That is, in certain contexts, the receiver may lose track of positioning system signals. In such a case, the device may operate in a free running mode whereby the last corrected time base is continuously utilized after loss of signal acquisition for a certain period (e.g., a predefined period) without further correction. However, after the predefined period, the accuracy of the time base may drift such that further acquisition of signals utilizing the last corrected time base may not be possible due to the errors introduced by frequency drift in the uncorrected free running time base. In this regard, the system may utilize the switch to provide synchronization data from the first source to, for example, one again prime the positioning system receiver to reacquire a signal.

This flexibility of switching between synchronization data may be important for this reason to provide for flexible synchronization of the data. Furthermore, given a single local oscillators utilized in the system, rather than providing discrete timing systems associated with each synchronization source, the very synchronization sources may be utilized to correct a single given oscillator of the device. In this regard, synchronous correction of the reference oscillator may be accomplished to provide highly accurate time base corrections to the device.

In this regard, a first aspect includes a system for synchronizing a local clock at a device. The system includes a local reference oscillator operative to generate a time base for the device. The system also includes a network interface module in operative communication with an asynchronous packet-switched communication network to receive a synchronization data communication of synchronization data from the asynchronous packet-switched communication network. The system further includes a positioning system receiver operative to receive at least one positioning system signal from a positioning system. In turn, the system includes a synchronization module in operative communication with the network interface module and the positioning system receiver and configured to synchronize the local reference oscillator using the synchronization data communication from the network interface module in a first time period and the at least one positioning system signal from the positioning system receiver in a second time period.

A number of feature refinements and additional features are applicable to the first aspect. These feature refinements and additional features may be used individually or in any combination. As such, each of the following features that will be discussed may be, but are not required to be, used with any other feature or combination of features of the first aspect.

For instance, the positioning system receiver may include a signal acquisition module to acquire the at least one positioning system signal based on the local reference oscillator in the first period in which the local reference oscillator is corrected using the synchronization data communication from the network interface module. That is, the positioning system receiver may utilize a corrected time base that is based on the synchronization data received from the asynchronous packet-switched communication network. As such, the second time period may be subsequent to the first time period and the at least one position system signal may be acquired using the local reference oscillator corrected using the synchronization data communication from the network interface module.

In an embodiment, the synchronization module may include a network synchronization module operative to generate first synchronization data from the synchronization data communication and a positioning system synchronization module operative to generate second synchronization data from the at least one positioning system signal. The synchronization module may include at least one switch for selection of the first synchronization data or the second synchronization data for use in correction of the local oscillator.

In an embodiment, the system may include a coarse time adjustment module operative to vary a voltage supplied to the local reference oscillator and a fine time adjustment module comprising a dividing module operative to alter a counter value corresponding to a pulse per second output of the time base. For instance, the dividing module may be utilized to make fine adjustment to a frequency output of the oscillator. In addition to the dividing module, the system may also include a delay module for making adjustments to the phase of the output of the oscillator.

In an embodiment, the positioning system receiver may be a GNSS receiver, and the second synchronization data comprises frequency and phase synchronization data. The positioning system receiver may include an integration module (e.g., for coherent and/or non-coherent) integration of signals during acquisition. In turn, an integration time period (e.g., locally defined by the oscillator) may be in phase with the positioning system based on synchronization of the local reference oscillator by the second synchronization data. Such an integration time period may relate to coherent or non-coherent integration.

In an embodiment, the system may include a quality assessment module operative to compare a corrected time base based on the synchronization data from the asynchronous packet-switched communication module to a quality threshold. In this regard, selection of the synchronization data (e.g., by the switch of the system) may be at least in part based on the quality assessment module.

A second aspect includes a method for providing time and frequency synchronization data to a GNSS receiver. The method includes receiving, via a connection to a packet-based network of computers, packet data containing information about the current time and deriving time and frequency information from the received packet data. The method also includes receiving RF signals from a global navigation satellite that contain information about the current time and deriving time and frequency information from the signals from the global navigation satellite. The method may also include switching between the time and frequency information derived from the received packet data and the time and frequency information derived from the global navigation satellite as the time and frequency provided to and used by the GNSS receiver.

A number of feature refinements and additional features are applicable to the second aspect. These feature refinements and additional features may be used individually or in any combination. As such, each of the following features that will be discussed may be, but are not required to be, used with any other feature or combination of features of the second aspect.

For instance, the method may also include using the time and frequency information derived from the received packet data to prime the operation of deriving time and frequency information from the signals from the global navigation satellite. The method may also include determining if the time and frequency information derived from the received packet data has errors less than a predetermined threshold. In turn, the method may include switching from the time and frequency information derived from the received packet data to the time and frequency information derived from the global navigation satellite once the error is determined to be less than the predetermined threshold.

A third aspect includes a method for correction of a time base at a device. The method includes receiving a synchronization data communication comprising first synchronization data at the receiver from an asynchronous packet-switched communication network. The method further includes correcting at least a frequency component of the time base to generate a frequency corrected time base at the device based on the first synchronization data received from the asynchronous packet-switched communication network. In turn, the method may include acquiring at least one positioning system signal utilizing the frequency corrected time base and synchronizing the frequency component and a phase component of the time base utilizing the at least one positioning system signal to generate a frequency and phase corrected time base.

A number of feature refinements and additional features are applicable to the third aspect. These feature refinements and additional features may be used individually or in any combination. As such, each of the following features that will be discussed may be, but are not required to be, used with any other feature or combination of features of the third aspect.

For instance, the method may include utilizing the frequency and phase corrected time base to coherently integrate received positioning signals over a coherent integration period. In turn, the coherent integration period may be in phase relative to the positioning signals received. Furthermore, non-coherent integration may also be employed such that the time base for the non-coherent integration is also synchronized. The method may also include comparing the frequency corrected time base to a threshold quality prior to the acquiring. The frequency corrected time base may be utilized in the acquiring only when the accuracy of the frequency corrected time base exceeds the threshold quality.

In an embodiment, the method may also provide for reacquisition of positioning system signals in the event the signals are lost (e.g., due to attenuation of the signal or the like). In turn, the method may include detecting a loss of acquisition of any positioning signal system and continuing to operate the device using the time base without correction. The method may also include repeating the method at a predetermined time period after the detecting. That is, new synchronization data may be received via the asynchronous packet-switched communication network to allow for reacquisition of the positioning system signal in the event of the loss of the signal.

Furthermore, the corrected time base may be used in connection with other components of a device. In this regard, the method may be implemented by a device such as an LTE base station, VoIP phone, or other appropriate device. Accordingly, the method may include utilizing the frequency and phase corrected time base in connection with a downstream communication operation (e.g., associated with an LTE base station, VoIP phone, or the like).

DETAILED DESCRIPTION

Figure 1:
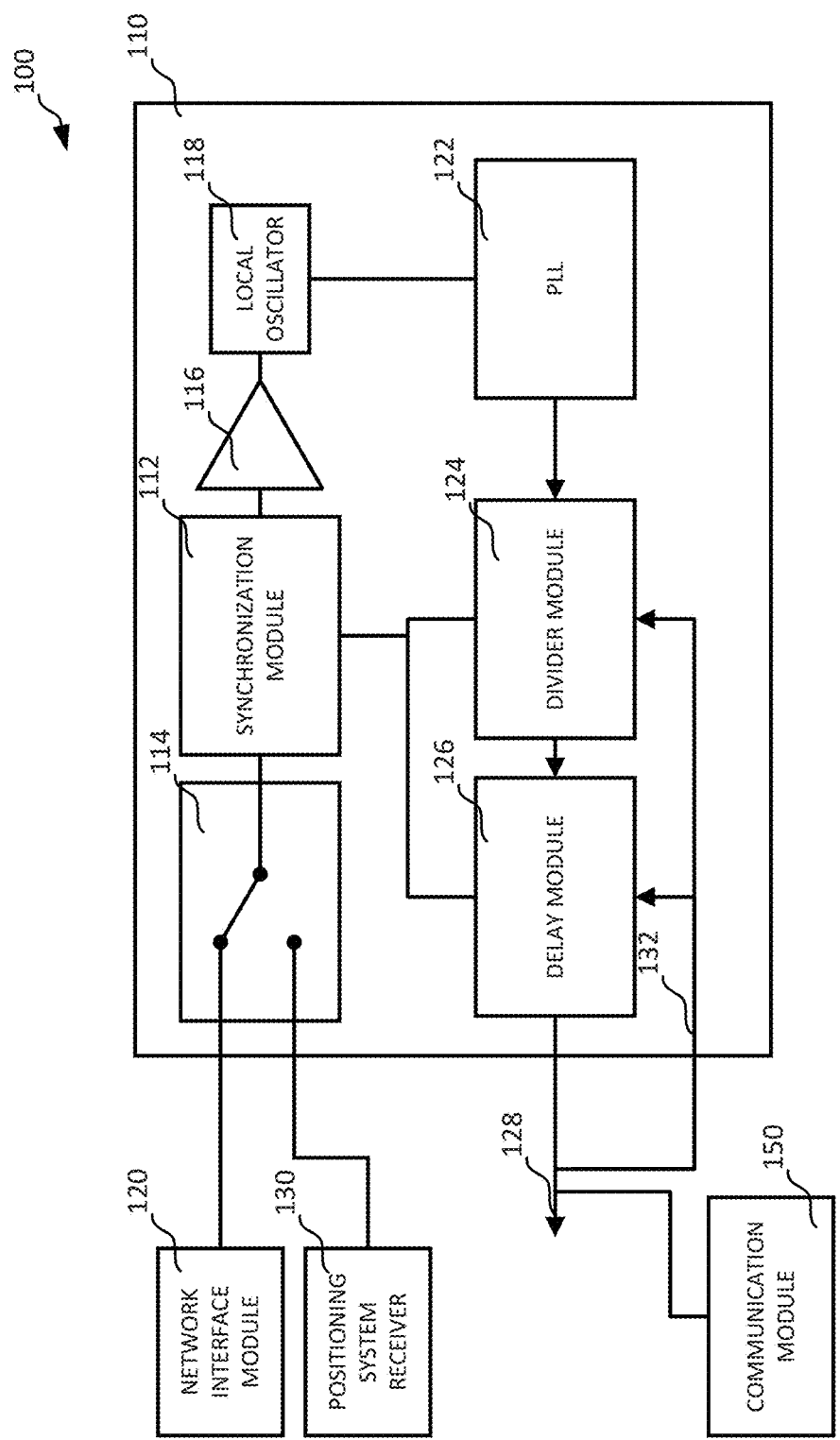
FIG. 1 depicts a schematic view of an embodiment of a system for hybrid timing.

While the disclosure is susceptible to various modifications and alternative forms, specific embodiments thereof have been shown by way of example in the drawings and are herein described in detail. It should be understood, however, that it is not intended to limit the disclosure to the particular form disclosed, but rather, the disclosure is to cover all modifications, equivalents, and alternatives falling within the scope as defined by the claims.

The present disclosure generally relates to correction (e.g., synchronization) of a time base at a device. For instance, the time base of the device may be synchronized to an external time reference such as UTC. Specifically, the present disclosure provides for a hybrid approach to synchronization of the time base that may leverage a plurality of sources of synchronization data to synchronize a local oscillator of the device. In this regard, advantages of each source of synchronization data may be maximized while minimizing the disadvantages of each source such as those identified above. In an embodiment, the present disclosure presents a coupled approach to synchronization that utilizes IP synchronization (i.e., synchronization data received from an asynchronous packet-switched communication network) techniques as well as GNSS synchronization.

For example, and as briefly addressed above, current techniques for synchronization may include use of PTP, network time protocol (NTP), or GNSS, with no combination or coupling thereof. Coupling has traditionally not been required since the typical GPS receiver has significantly (e.g., 30 dB or roughly 1000 times) worse sensitivity than contemplated receivers that utilize techniques described in U.S. Pat. No. 7,961,717, which is co-owned with the present application and incorporated by reference in its entirety. Given the lower sensitivity of traditional GPS receivers, such traditional devices typically do not require an initial bootstrap to the degree extremely sensitive GNSS devices may. Rather, the PTP time source (e.g., using IEEE 1588 V2) may be used continuously to provide time. Alternatively, in the case of available receipt of GPS signals, GPS with a higher power signal and outdoor or a lightly-attenuated environment is used to provide time such that high sensitivity receivers are not required. Importantly, either technique has traditionally been utilized exclusively of the other. However, as addressed above, each approach in isolation may suffer from disadvantages that limit the usefulness of the approaches used alone.

As will be discussed in greater detail herein, use of a first source of synchronization data (e.g., synchronization data received from an asynchronous packet-switched communication network) may be used in coordination with a second source of synchronization data (e.g., received positioning signals such as GNSS signals). In this regard, a device may be provided that has a single oscillator that is corrected using a plurality of sources of synchronization data.

In turn, a synchronization module may be provided in operative communication with the local oscillator. The local oscillator may control frequency and phase of a local time base of the device. Because each of the frequency and phase of the resulting timing system may collectively define the time base, and because each of the frequency and phase of the timing system may be controlled independently, the time base may be defined by a frequency portion and a phase portion. That is, the frequency portion may refer to the resulting frequency of the timing system (e.g., a timing signal output therefrom) and the phase portion may reefer to the resulting phase of the timing system (e.g., a timing signal output therefrom).

In this regard, the synchronization module may be operative to correct a frequency portion and/or a phase portion of the time base of the device based on synchronization data input to the synchronization module. As described above, a plurality of sources of synchronization data may be provided in selective communication with the synchronization module. For instance, a switch may connect either a network interface module or a GNSS positioning receiver to the synchronization module. In turn, either the network interface module or positioning receiver may provide the synchronization data used to correct the time base of the device. For instance, the sources of synchronization data may be used serially to synchronize the time base of the device.

For instance, a highly sensitive GNSS receiver (e.g., a GPS receiver) may require a frequency accuracy of +/−100 Hz at the L1 center frequency of 1.5742 GHz and phase accuracy within +/−50 μs in order to acquire very weak GPS or GNSS signal. This level of timing accuracy may be achieved using a PTP (e.g., IEEE 1588 V2) or NTP internet IP protocol to deliver a time reference derived from the IP connected receiver. As such, a synchronization module in operative communication with a network interface module may receive synchronization data over an asynchronous packet-switched communication network and may use this data to correct the local oscillator using the PTP/NTP packet recovery and then synchronize a 1 pulse per second (PPS) signal to the IP derived time reference. This may be used to prime the positioning system receiver to the preferred accuracy level of +/−100 MHz and +/−50 μs, which may also use the time base of the device in operation. As such, once there is a GNSS/GPS acquisition with this relatively coarser grade time reference, the GNSS/GPS signal can be used directly to refine the frequency to an accuracy of within about +/−0.25 Hz) and the time reference to within about +/−300 ns. The discussion that follows below details this capability.

The techniques disclosed herein provide a hybrid approach that may utilize an internet based timing and frequency generation system (e.g., PTP, NTP, or the packet-based approach described in the '717 patent incorporated by reference above) and the GNSS (e.g., GPS) timing and frequency system. This involves coupling and control of the two systems using the same reference oscillator. This provides for an initial priming of the GNSS satellite search requiring time and frequency and the seamless transfer of control to the GNSS system for precise time and frequency.

With further reference to FIG. 1, a device 100 is depicted that may include a timing system 110 that may be utilized to provide a corrected time base for operation of the device 100. The timing system 110 may include a synchronization module 112 that is in operative communication with a switch 114. The switch 114 may be operative to receive inputs from a network interface module 120 or a positioning system receiver 130. In this regard, the network interface module 120 or the positioning system receiver 130 may provide input in the form of synchronization data to the switch 114. In this regard, the switch 114 may be operative selectively provide synchronization data to the synchronization module 112 from either the network interface module 114 or the positioning system receiver 130.

The synchronization module 112 may provide an output to a local oscillator 118. The local oscillator 118 may be a voltage controlled oscillator. In this regard, the frequency of the oscillator 118 may be controlled by way of control of an input voltage to local oscillator 118. In this regard, the synchronization module 112 may be in operative communication with a digital to analog converter 116 that is operative to vary an input voltage to the local oscillator 118 to provide coarse control over the frequency of the oscillator 116. In this regard, the synchronization module 112, in response to or based on the synchronization data received by way of the switch 114 from either the network interface module 120 or the positioning system receiver 130 may be operative to provide inputs to the digital to analog converter 116 to provide course frequency regulation of the local oscillator 118. As such, the synchronization module 112 and digital to analogue converter 116 may collectively define a coarse adjustment module for making coarse frequency adjustments to the oscillator 116 (i.e., and in turn the frequency portion of the time base of the device). In an embodiment, the oscillator 116 may have an output frequency of from about 10 MHz to about 38 MHz.

However, the local oscillator 118 may also be provided with fine control of the frequency output therefrom. For example, the local oscillator 118 may provide input to a phase locked loop 122 that may be capable of providing varying frequencies based on the input from the local oscillator 118. For instance, the phase locked loop 122 may output a frequency of about 200 MHz. In this regard, the output of the phase locked loop 122 may be input into one or more modules capable of processing the output signal from the phase locked loop 122. For example, a divider module 124 may be provided. In this regard, the divider module 124 may receive an input corresponding to counter value that allows for division of the frequency input from the phase locked loop 122 to provide a varied output frequency based on the counter value received at the divider module 124. For example, in an embodiment, the divider module may be a 64 bit module, which may be capable of modifying a frequency with a resolution of about 10 ppb. In this regard, the divider module 124 may provide frequency accuracies within about 50 ppb. In this regard, the divider module 124 may comprise a fine control module for making fine adjustments to the output frequency from the phase locked loop such that the divider module 124 is capable of outputting a corrected frequency based on the received counter input. As such, the synchronization module 112 may provide the counter input to the divider module 124. For example, the synchronization module 112 may provide a counter value to the divider module 124 that provides the divisor for the division operation performed on the output signal from the phase locked loop 122. In this regard, fine control over the output frequency the divider module 124 may be established.

The timing system 110 may also include delay module 126. The delay module 126 may also receive an input from the synchronization module 112 corresponding to a counter value that corresponds to a delay imposed by the delay module on the signal output from the divider module 120. In this regard, the delay module 126 may be utilized to vary the phase of the signal output from the delay module 126 such that the delay module 126 may be operative to modify the phase of a signal output from the delay module 126. In this regard, a timing signal 128 may be output from the delay module 128. The timing signal 128 may be utilized in a feedback loop to the delay module 126 and/or to the divider module 124 to assist with control of synchronization of the timing signal 128 as will be discussed in greater detail below. In an example, the delay module 126 may also be a 64 bit module. In turn, the delay module 126 may provide phase adjustments at a resolution of about 10 ppb. As such, accuracies within about 50 ppb may be provided by the delay module 126.

The divider module 124 and the delay module 126 may selectively modify the values applied to the signal to coordinate the change in connection with a PPS signal output by the timing system 110. In this regard, the correction of the timing signal 128 may occur synchronously with the timing signal 128 based at least in part on the return signal 132 fed back to the delay module 126 and the divider module 124.

Figure 4:
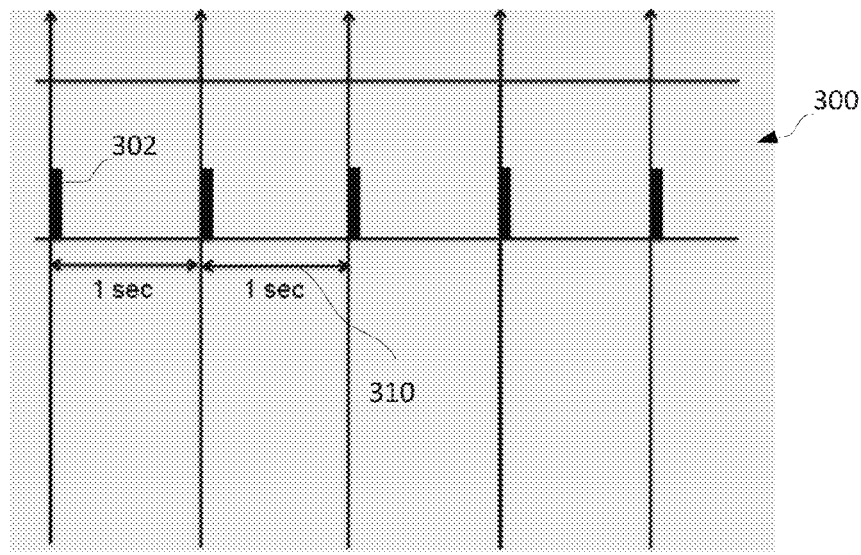
Figure 5:
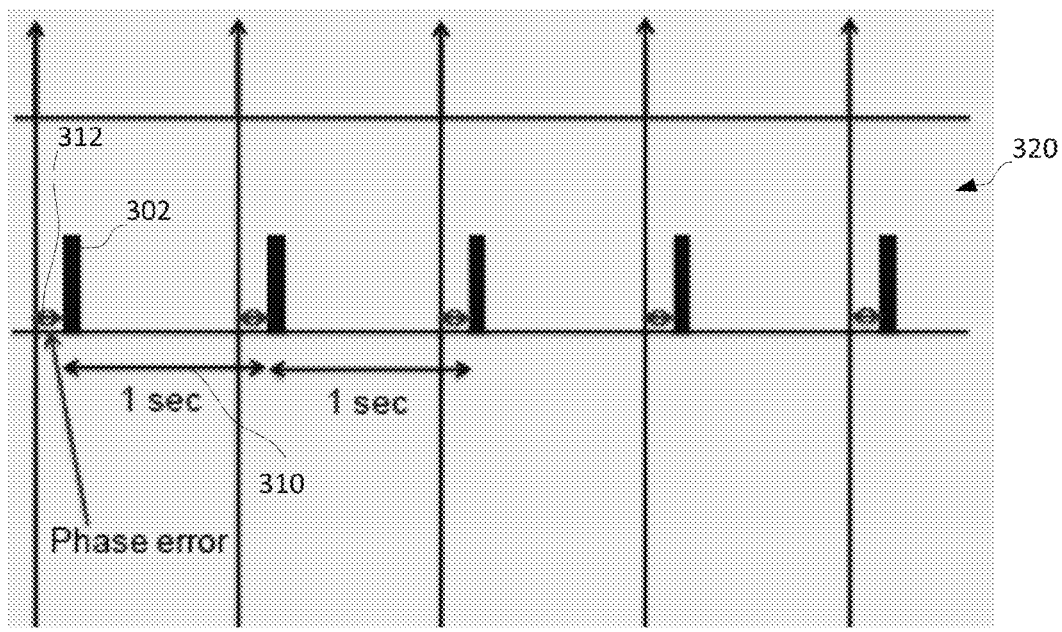

For example, with further reference to FIG. 4, an idealized pulse per second (PPS) signal 300 is depicted. For instance, the PPS signal 300 may correspond to a master time base to which the device 100 is to be synchronized. In an embodiment, the PPS signal 300 may be a time base of a positioning system (e.g., GPS or other GNSS system). The PPS signal 300 may have a period 310 of one second such that a rising pulse 302 occurs at each successive interval of the one second period 310. While discussed herein is a pulse per second signal, it may be appreciated that other time signature signal variants may be provided such as signal having a plurality of pulses per second such as, for example, two pulses per second, three pulses per second, etc. With further reference to FIG. 5, a signal 320 having a phase error 312 is depicted. In this regard, the signal 320 may have an accurate frequency such that each subsequent pulse occurs in a period 310 of one second as does the idealized signal 300. However, the occurrence of the pulse 302 may not coincide with the period of the idealized signal 300 such that there is a phase error 312 at each pulse.

Figure 6:
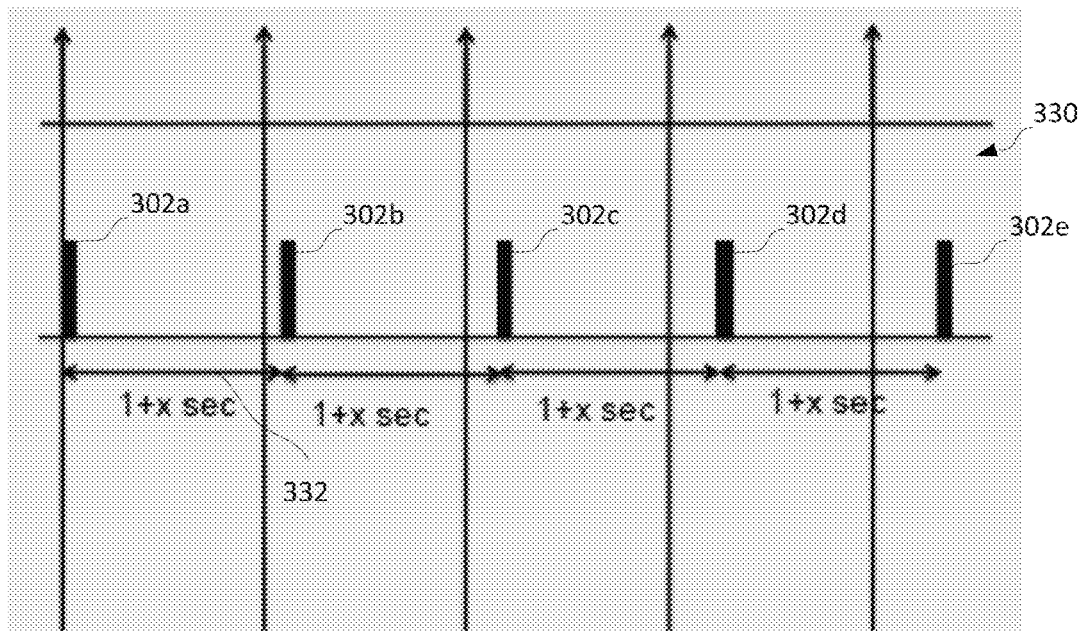
Figure 7:
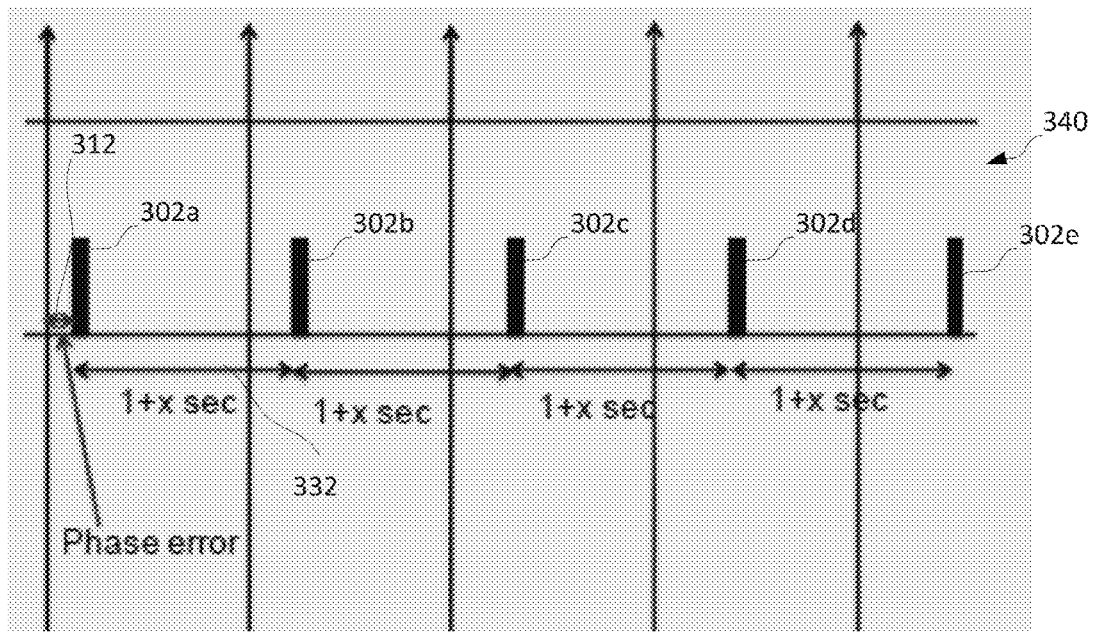

Additionally, FIG. 6 depicts a signal 330 having a frequency error. In this regard, while an initial pulse 302a may occur in phase with the idealized signal 300, a subsequent pulse 302b may occur at a period 322 of greater than or less than the one second period 310 of the idealized signal 300. In FIG. 6, the signal 330 may have a period 332 of greater than one second indicative of a frequency lower than the ideal signal 300. For instance, the frequency error may result from frequency error in the local oscillator 118. Accordingly, with each subsequent pulse in the signal 330 after the initial pulse 302a, the error in the signal 330 may grow larger associated with the frequency error of the signal, which results in the error in period 332. With further reference to FIG. 7, a signal 340 having a phase error 312 and a frequency error (i.e., resulting in a phase 332 that is in error). In this regard, the signal 340 may combine the errors associated with the signals 320 and 330 addressed above.

Figure 8:
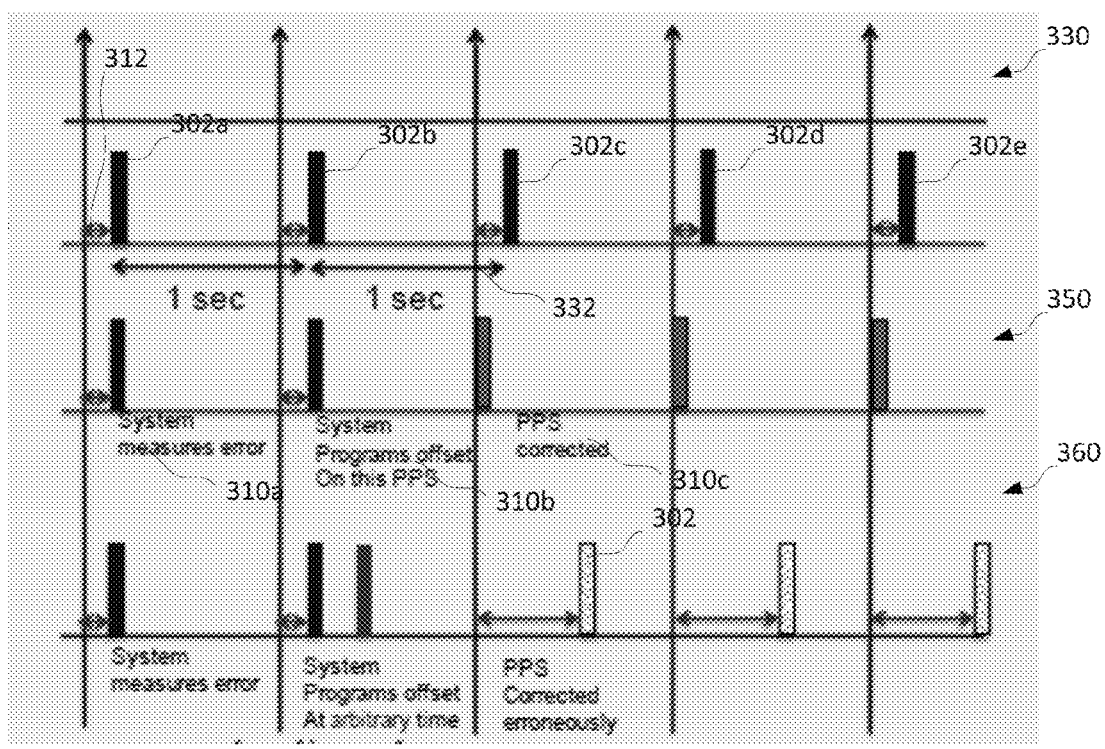

In this regard, FIG. 8 depicts correction of a signal 320 having a phase error 312. Specifically, a corrected signal 350 is depicted in FIG. 8. As such, in a first period 310a, the timing system 110 may measure the error in the system in relation to the idealized timing signal 300. In the second period 310b the system 110 may program an offset for the signal 320. For example, an updated counter value may be provided to the delay module 126 to adjust the phase of the signal. As such, in a third period 310c, the corrected signal 350 may be realized by implementing the correction in synch with the next PPS period 310c. That is, the correction may be implemented with reference to the return signal 132 such that the correction is implemented at the initiation of the next period 310c of the idealized signal 330. In turn, the subsequent pulse 302c of the corrected signal 350 may be in phase and have a corresponding frequency to the idealized signal 300. In this regard, with returned reference to FIG. 1, given that the delay module 126 and divider module 124 may receive the information regarding the time signal 128 via the return signal 132, the divider module 124 and delay module 126 may program a correction in either phase or frequency of the timing signal 128 to occur synchronously with the period of the idealized signal 300. That is, the timing of the correction imparted by the delay module 126 and divider module 124 may be at least partially based on the output timing signal 128 such that synchronous correction may occur.

In contrast, signal 360 shown in FIG. 8 demonstrates the result if the correction of the phase of the signal occurs arbitrarily. In this regard, it may be appreciated that the resulting pulses 302c, 302d, and 302e in the signal after correction may still not be in phase.

Figure 9:
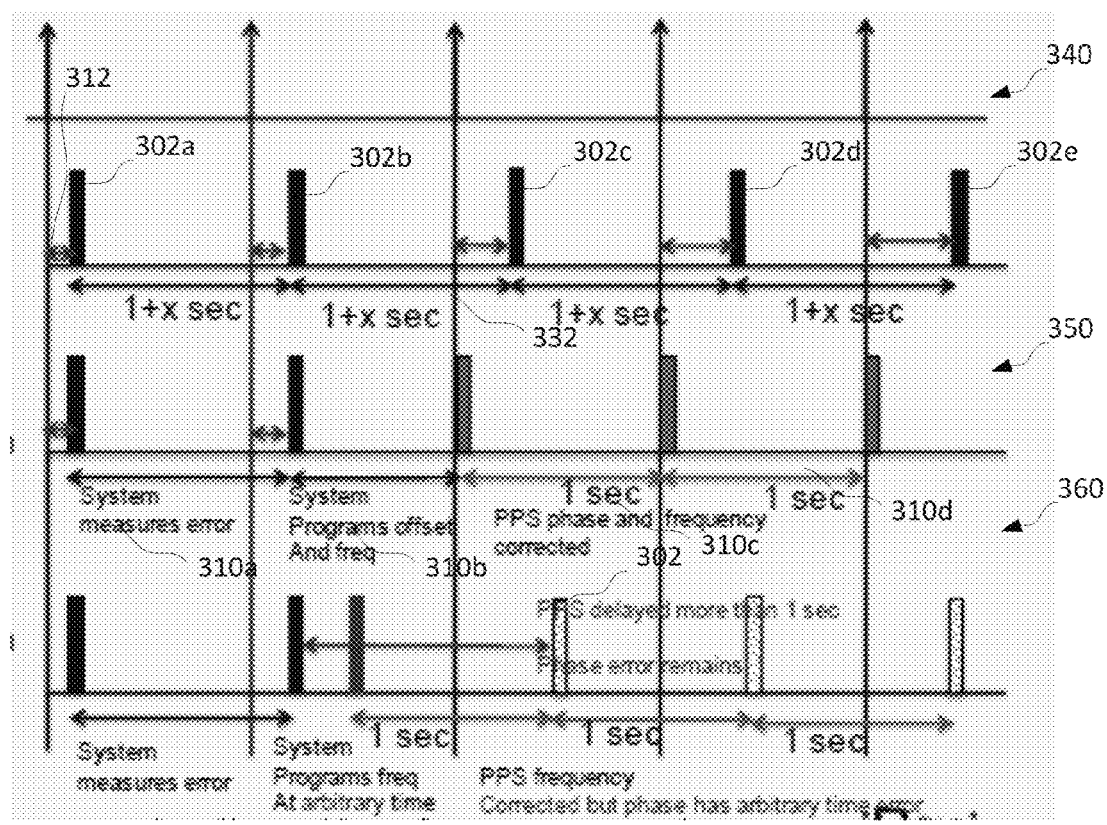

With further reference to FIG. 9, it may be appreciated that such a synchronous approach to generating a corrected signal 350 may also be applied to a signal 340 having both frequency and phase errors. Again, the system may measure a system error in relation frequency and phase in first period 310a and generate the correction factor for both period and phase in the second period 310b. In this regard, the third period 310c, the correction values for both phase and frequency may be applied synchronously with the idealized timing signal 300 such that subsequent periods 310d et seq. may be corrected for both frequency and phase. In contrast, the signal 360 showing in FIG. 9 includes a correction that is arbitrarily applied. In turn, the resulting pulse per second signal may continue to be out of phase even if the frequency is corrected for the signal 360.

In an embodiment, the timing signal 128 output from the timing system 110 may be provided to a communication module 150. For example, the device 100 may be a communication station capable of facilitating a downstream communication operation. In an embodiment, the communication module 150 may comprise an LTE base station or the like. In this regard, the communication module 150 may include communication componentry such as a transceiver, a receiver, a transmitter, a processor, or other components to facilitate communication. In any regard, the timing signal 128 may be provided to the communication module 152 for timing associated with the components thereof. Furthermore, as the device 100 may include a GNSS receiver 130, the location of the device 100 may be determined autonomously based on received positioning system signals.

Figure 2:
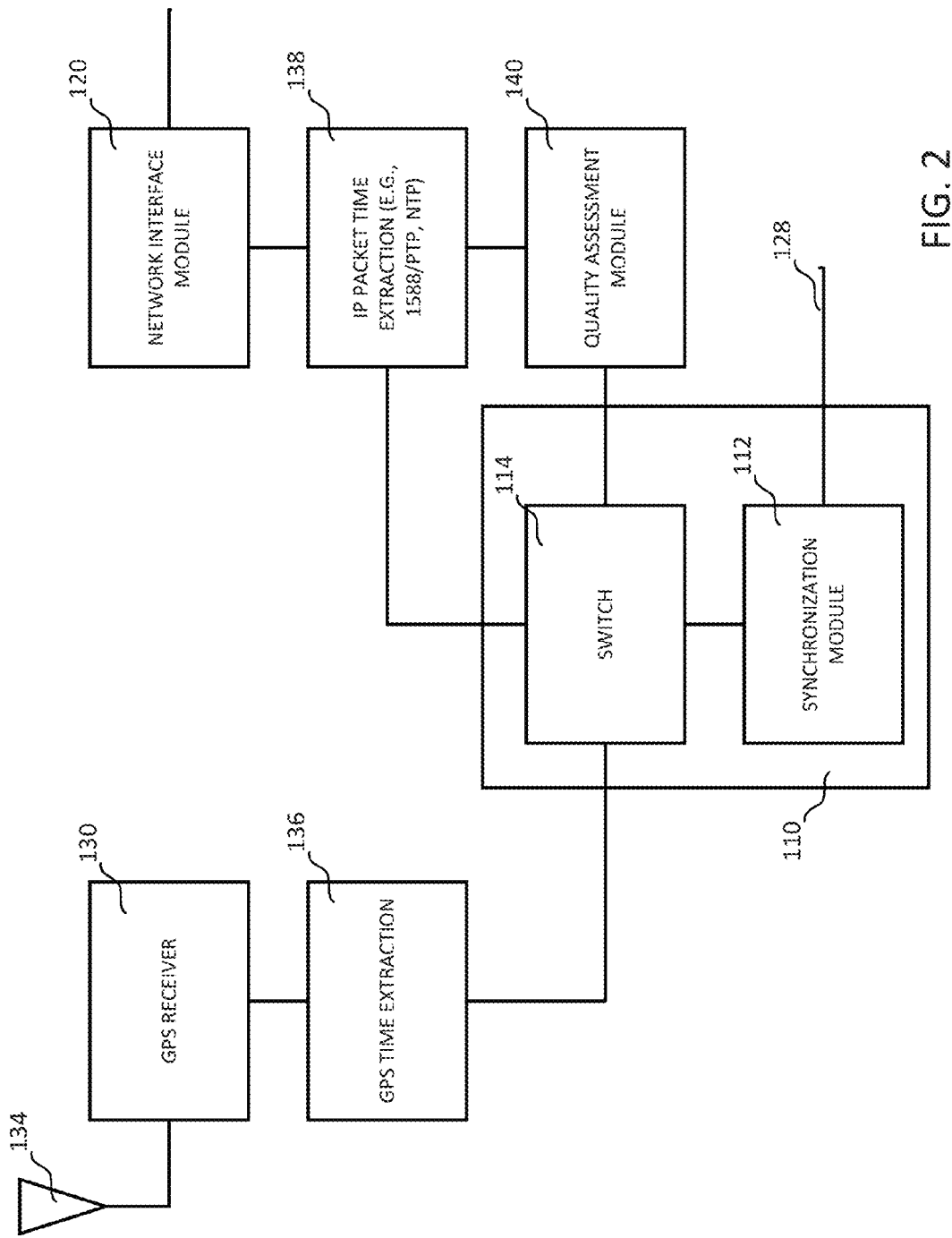
FIG. 2 depicts a schematic view of a functional block diagram of the system of FIG. 1.

With further reference to FIG. 2, a functional diagram of the system 100 is depicted. As shown, the GPS receiver 130 may be in operative communication with an antenna 134 for receiving GPS signals. In this regard, a GPS time extraction module 136 may be provided that allows for processing of received GPS signals at the GPS receiver 130 to extract timing information corresponding to the positioning system from which the GPS signals are received at the GPS receiver 130. In this regard, GPS time extraction module 136 may be operative to provide synchronization data in the form of frequency and/or phase correction data for use by the synchronization module 112.

FIG. 2 also depicts a network interface module 120. The network interface module 120 may be in operative communication with an IP network (e.g., asynchronous packet-switched communication network). The network interface module 120 may also be in operative communication with an IP time extraction module 138. In this regard, the IP packet time extraction module 138 may be operative to derive synchronization data in the form of frequency and/or phase correction data from synchronization communications received at the network interface module 120. For example, as shown, the protocol utilized by the IP packet time extraction module 138 may correspond to any of the protocols described above. As may be appreciated, the IP time extraction module 138 may be operative to provide an output to the switch 114 as described above. Furthermore, the IP time extraction module 138 may provide an input to a quality assessment module 140. In this regard, the quality assessment module 140 may be operative to determine if the quality of the synchronization data extracted from the IP packet time extraction module 138 exceeds a threshold (e.g., whether errors in the synchronization data extracted from the synchronization commination received over the asynchronous communication network is less than a threshold error value). For instance, the threshold values may be based on the preferred accuracy for the GNSS receiver of within about +/−100 Hz and +/−50 μs.

For example, the quality assessment module 140 may be in further operative communication with the switch 114. In this regard, the upon determining that the IP time extraction module 138 has provided a sufficiently accurate corrected time base (e.g., the time output based on correction from the IP time extraction module 138 may exceed a threshold the quality threshold), the quality assessment module 140 may provide data to the switch 114 that allows the switch 114 to select the synchronization data provided from the GPS time extraction module 136. For instance, once the time base as corrected by the IP packet time extraction module 138 is sufficient for GPS signal acquisition, the switch 114 may change to the GPS time extraction module 136 such that synchronization data derived from the GPS signals received may be used as an input to the synchronization module 112. This may allow for synchronization of the time base to within about +/−0.25 Hz and +/−300 ns. Additionally or alternatively, the GPS time extraction module 136 may provide data to the quality assessment module 140 (e.g., indicative of the acquisition of GPS signals capable of providing synchronization information) that may control the operation of the switch 114. In any regard, as discussed above, the switch 114 may be operative to provide a selected one of synchronization data from the GPS time extraction module 136 or IP packet time extraction module 138 to the synchronization module 112 for use in outputting a timing signal 128.

Figure 3:
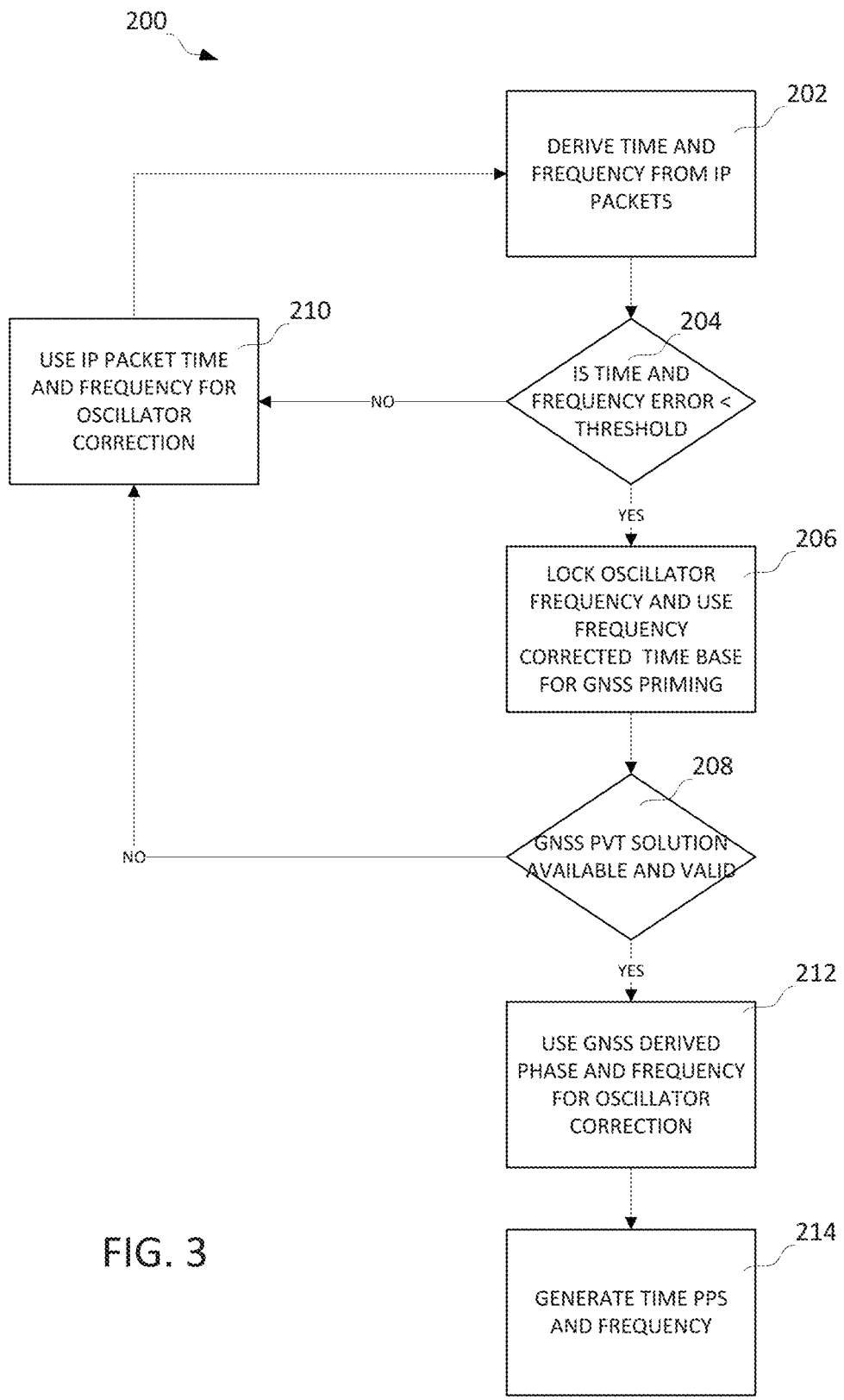
FIG. 3 depicts an embodiment of a method for synchronization of a time base of a device.

FIG. 3 depicts a method 200 that may be utilized (e.g., by a timing system 110 as described above). The method 200 may begin by deriving 202 time and frequency information from IP packets received over the asynchronous packet-switched data communication network. It may be determined 204 whether the time and frequency error derived based on the synchronization data received from the packet-switched network is less than a threshold quality (e.g., as described above in relation to the quality assessment module 140). In the event that the time and frequency error is not less than the predetermined threshold quality, the method may proceed and use 210 further IP packet time and frequency information for oscillator correction. For example, in the protocols described above, subsequent receipt of additional packets may allow for convergence for more accurate time and frequency correction of the local oscillator 118 upon additional synchronization data being received at the network interface module 120. In this regard, the method 200 may repeat until the time and frequency derived from the synchronization data received from the asynchronous packet-switched network is lower than the threshold established. As may be appreciated, frequency information may be derived from the PTP. Furthermore, an estimation of phase alignment may also be provided by determining a "lucky-enough packet." A lucky-enough packet may be one that has a relatively symmetric upstream and downstream path such that the difference in the upstream time and downstream times may be used to accurately correct phase (e.g., to within the threshold values described above).

As such, once the time and frequency error of the corrected time base meets the quality threshold, the method may proceed and lock 206 the oscillator frequency based on the synchronization data received from the asynchronous packet-switched communication network. In an embodiment, the corrected time base based on the received synchronization data by way of the asynchronous packet-switched communication network may allow for priming of a GNSS receiver at a device. In this regard, step 206 may also include utilizing the frequency corrected time base for GNSS priming. In this regard, the GNSS receiver may attempt to acquire positioning system signals from the positioning system. As such, the method may include determining whether a GNSS solution is available and valid at 208. In the event that the solution is not available, the method may repeat to using 210 IP packet time and frequency data n an attempt to provide a more accurate time base for use in acquiring GNSS signals.

However, if a GNSS solution is available and valid, the method may proceed to step 212 where the GNSS derived signals are utilized for frequency and phase correction of the oscillator such as that described above in relation to FIG. 1. The method may also include generating 214 a pulse per second (PPS) output based on the corrected time base corrected on the basis of the received GNSS signals. Furthermore, this time base including for example, a PPS signal, may be utilized to drive vacations modules of the LTE base station or the like associated with the device 100.

Also not explicitly shown but contemplated for use in the timing system 110 is a mechanism for the GPS receiver to go into a hold-over mode if GPS signal acquisition is lost. This mode allows for the system to continue to provide a PPS from the local oscillator after the last correction. In this mode the frequency will free run and eventually the oscillator frequency and PPS will be off an excessive amount of time for downstream devices like LTE base stations. Accordingly, the system could at some point (e.g., after a predetermined time or after a determined degradation of the time base) switch back to time and frequency correction based on synchronization data received from the network interface module 120. That is, the switch 114 may revert back to providing synchronization data based on the synchronization data received at the network interface module 120.

While the foregoing has illustrated and described several embodiments in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the disclosure are desired to be protected.

What is claimed is:

1. A system for synchronizing a local clock at a device, comprising:
    a local reference oscillator operative to generate a time base for the device;
    a network interface device in operative communication with an asynchronous packet-switched communication network to receive a synchronization data communication of synchronization data from the asynchronous packet-switched communication network;
    a positioning system receiver operative to receive at least on positioning system signal from a positioning system; and
    a synchronization module in operative communication with the network interface module and the positioning system receiver and configured to synchronize the local reference oscillator using the synchronization data communication from the network interface module in a first time period and the at least one positioning system signal from the positioning system receiver in a second time period;
    wherein the positioning system receiver acquires the at least one positioning system signal based on the local reference oscillator in the first period in which the local reference oscillator is corrected using the synchronization data communication from the network interface device.

2. The system of claim 1, wherein the second time period is subsequent to the first time period and the at least one position system signal is acquired using the local reference oscillator corrected using the synchronization data communication from the network interface device.

3. The system of claim 1, wherein the synchronization module comprises a network synchronization module operative to generate first synchronization data from the synchronization data communication and a positioning system synchronization module operative to generate second synchronization data from the at least one positioning system signal.

4. The system of claim 3, wherein the synchronization module comprises at least one switch for selection of the first synchronization data or the second synchronization data for use in correction of the local oscillator.

5. The system of claim 4, wherein the system comprises a coarse time adjustment module operative to vary a voltage supplied to the local reference oscillator and a fine time adjustment module comprising a dividing module operative to alter a counter value corresponding to a pulse per second output of the time base.

6. The system of claim 3, wherein the positioning system receiver is a Global Navigation Satellite System (GNSS) receiver, and wherein the second synchronization data comprises frequency and phase synchronization data.

7. The system of claim 6, wherein the positioning system receiver comprises an integration module for integration of signals during acquisition, wherein an integration time period is in phase with the positioning system based on synchronization of the local reference oscillator by the second synchronization data.

8. The system of claim 1, further comprising:
    a quality assessment module operative to compare a corrected time base based on the synchronization data from the network interface device to a quality threshold.

9. A method for providing time and frequency synchronization data to a Global Navigation Satellite System (GNSS) receiver, comprising;
    receiving, via a connection to a packet-based network of computers, packet data containing information about the current time;
    deriving time and frequency information from the received packet data;
    receiving RF signals from a global navigation satellite, the RF signals containing information about the current time;
    deriving time and frequency information from the signals from the global navigation satellite; and
    switching between the time and frequency information derived from the received packet data and the time and frequency information derived from the global navigation satellite as the time and frequency provided to and used by the GNSS receiver.

10. A method as defined in claim 9, further including using the time and frequency information derived from the received packet data to prime the operation of deriving time and frequency information from the signals from the global navigation satellite.

11. A method as defined in claim 9, further including determining if the time and frequency information derived from the received packet data has errors less than a predetermined threshold.

12. A method as defined in claim 11, further including switching from the time and frequency information derived from the received packet data to the time and frequency information derived from the global navigation satellite once the error is determined to be less than the predetermined threshold.

13. A method for correction of a time base at a device, comprising:

receiving a synchronization data communication comprising first synchronization data at the receiver from an asynchronous packet-switched communication network;

correcting at least a frequency component of the time base to generate a frequency corrected time base at the device based on the first synchronization data received from the asynchronous packet-switched communication network;

acquiring at least one positioning system signal utilizing the frequency corrected time base; and synchronizing the frequency component and a phase component of the time base utilizing the at least one positioning system signal to generate a frequency and phase corrected time base.

14. The method of claim 13, further comprising:

utilizing the frequency and phase corrected time base to integrate received positioning signals over an integration period, wherein the integration period is in phase relative to the positioning signals received.

15. The method of claim 13, further comprising:

comparing the frequency corrected time base to a threshold quality prior to the acquiring, wherein the frequency corrected time base is utilized in the acquiring only when the accuracy of the frequency corrected time base exceeds the threshold quality.

16. The method of claim 13, further comprising:

detecting a loss of acquisition of any positioning signal system;

continuing to operate the device using the time base without correction.

17. The method of claim 16, further comprising repeating the method at a predetermined time period after the detecting.

18. The method of claim 13, further comprising:

utilizing the frequency and phase corrected time base in connection with a downstream communication operation.

* * * * *

UNITED STATES PATENT AND TRADEMARK OFFICE
CERTIFICATE OF CORRECTION

PATENT NO. : 9,571,262 B2  
APPLICATION NO. : 14/985744  
DATED : February 14, 2017  
INVENTOR(S) : Kurby Page 1 of 1

It is certified that error appears in the above-identified patent and that said Letters Patent is hereby corrected as shown below:

In the Claims

Column 13, Line 44, Claim 1 delete "on" and insert therefore --one--

Signed and Sealed this
Twenty-fifth Day of April, 2017

Michelle K. Lee
*Director of the United States Patent and Trademark Office*